United States Patent [19]
Hearne

[11] Patent Number: 5,566,466
[45] Date of Patent: Oct. 22, 1996

[54] SPINDLE ASSEMBLY WITH IMPROVED WAFER HOLDER

[75] Inventor: John S. Hearne, Los Altos, Calif.

[73] Assignee: OnTrak Systems, Inc., Milpitas, Calif.

[21] Appl. No.: 270,043

[22] Filed: Jul. 1, 1994

[51] Int. Cl.⁶ ........................................... F26B 5/08
[52] U.S. Cl. .............. 34/58; 198/379; 294/106; 414/783; 414/936
[58] Field of Search .............. 34/58, 312, 317, 34/328; 198/345.1, 379; 414/744.8, 757, 783, 936; 294/106

[56] References Cited

U.S. PATENT DOCUMENTS 4,313,266  2/1982  Tam .
4,651,440  3/1987  Karl .......................... 34/317

FOREIGN PATENT DOCUMENTS 138737  5/1990  Japan .......................... 34/58

OTHER PUBLICATIONS

Higginson et al, Disc Support for Spin Drying, IBM Technical Disclosure Bulletin, V 18, No. 6, Nov. 1975.

Primary Examiner—F. Daniel Lopez
Attorney, Agent, or Firm—Blakely, Sokoloff, Taylor & Zafman

[57] ABSTRACT

A wafer holder which grips a wafer by its edges is disclosed. The wafer holder is mounted on a spindle assembly which spins the wafer so held, for example, to spin dry both the front and back side of the wafer. The wafer holder includes two pairs of wafer holding bumpers, each pair coupled to one end of a reciprocating arm which swings each pair inward and outward to define an open position for releasing or loading a wafer, and a closed position for holding the wafer. Each arm is coupled to an insert and thrust bearing allowing for rotation to provide the reciprocating motion. After the insert and thrust bearing have toggled past a predefined position while the wafer holder is in the closed position, further motion is prevented, to lock the wafer holder in the closed position. Further, the insert member rotates back and forth in response to up and down movement of a rod within the spindle to allow for opening and closing of the wafer holder.

22 Claims, 6 Drawing Sheets

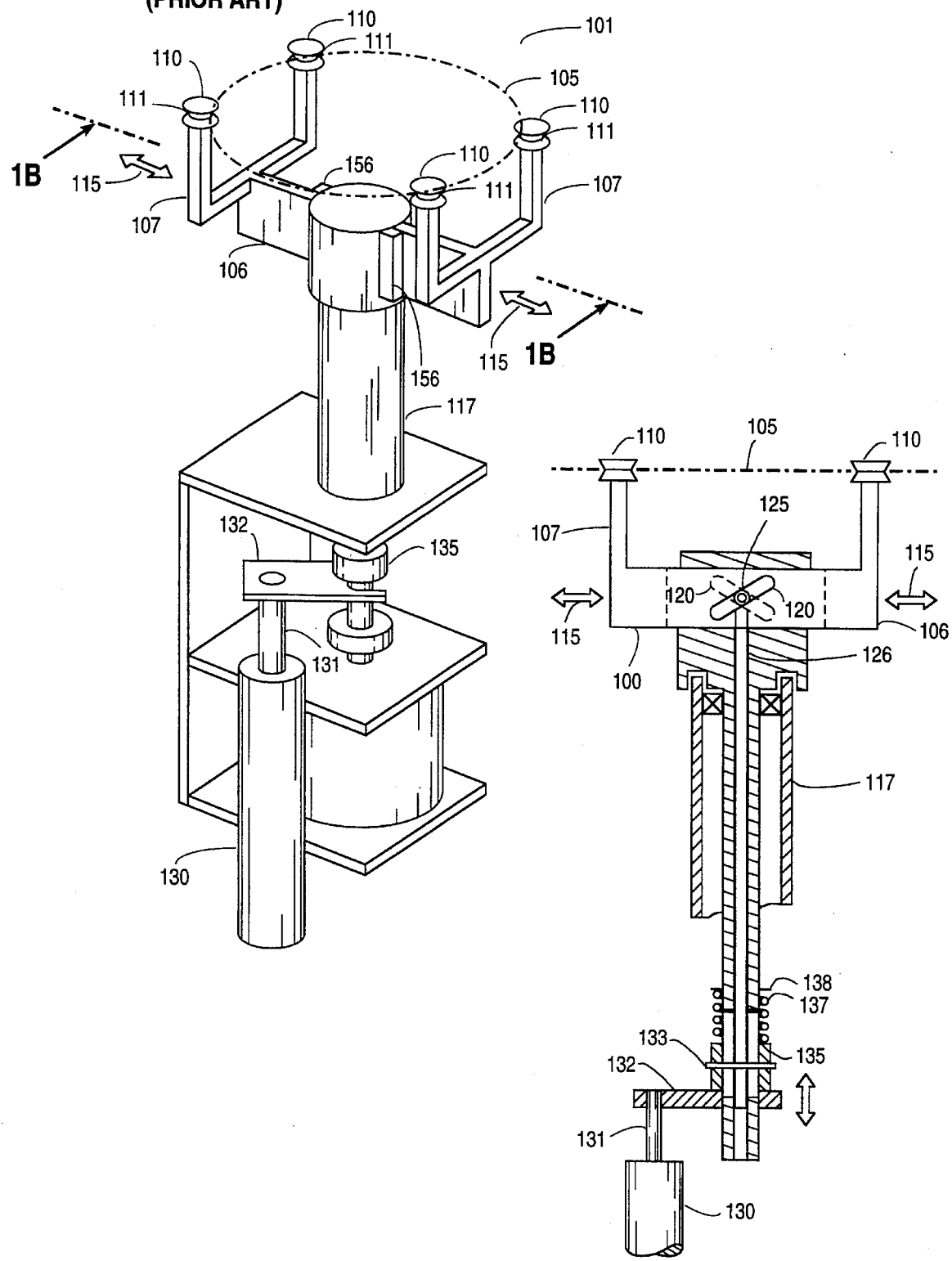

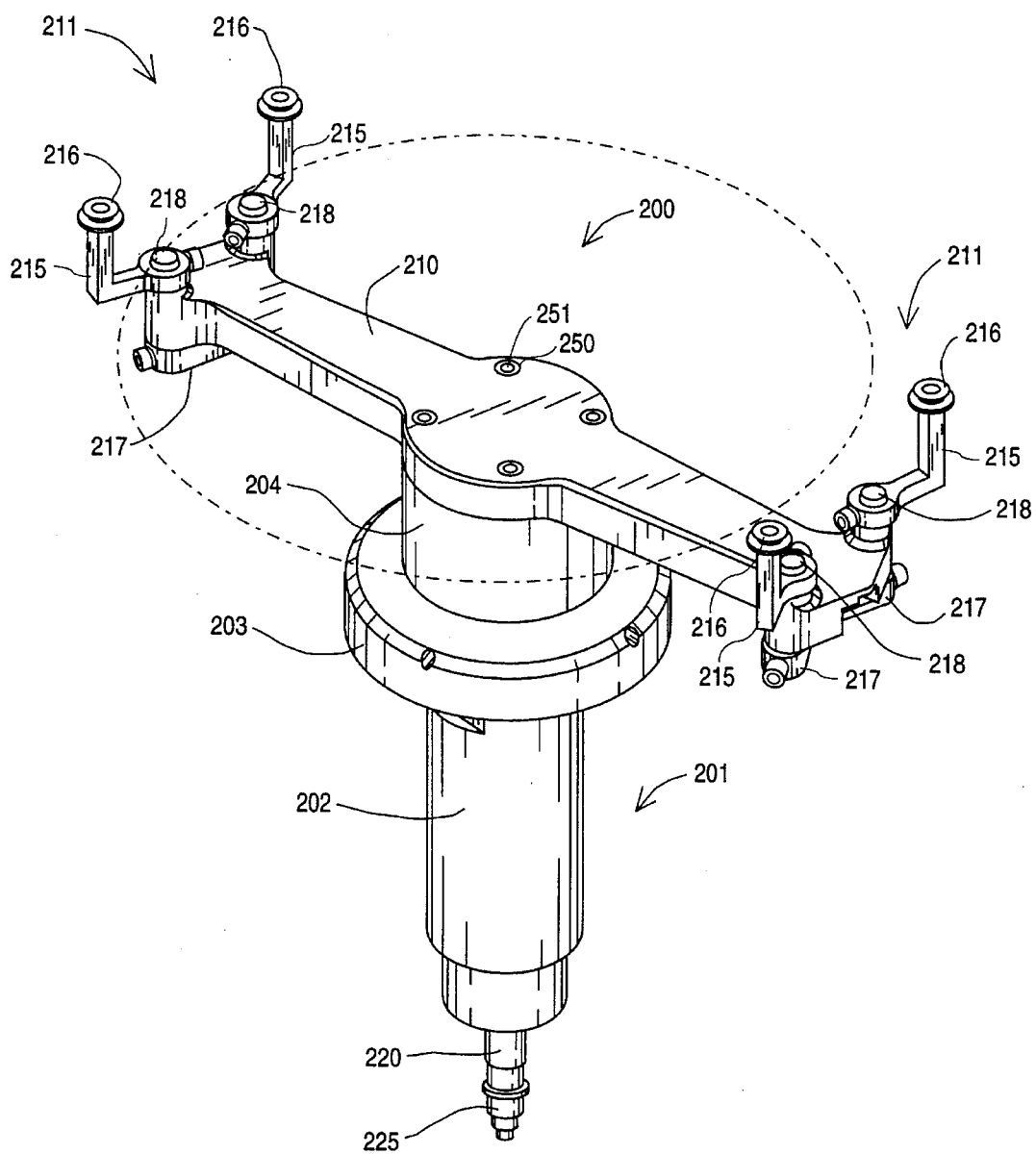
FIG_2

FIG_3
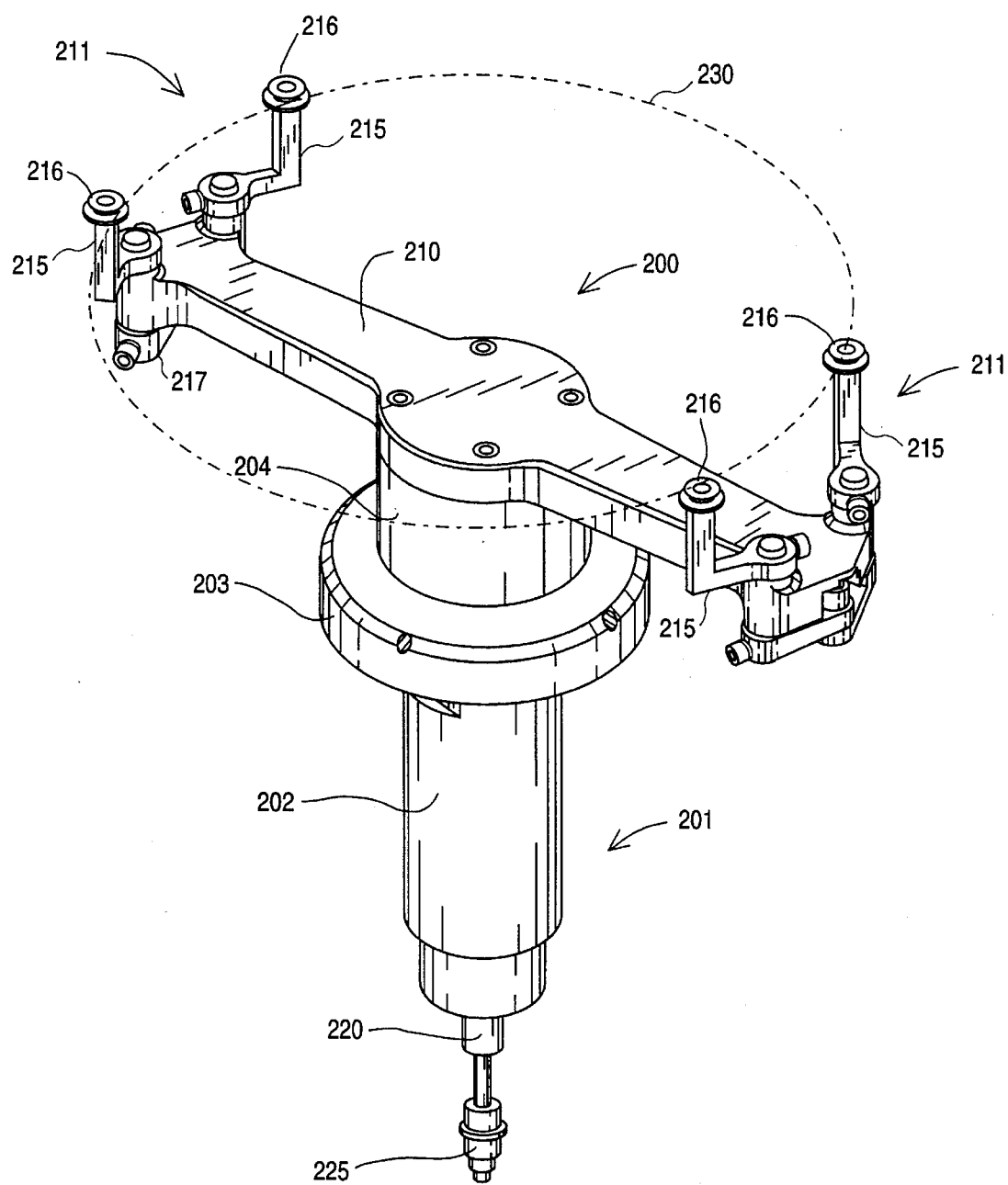

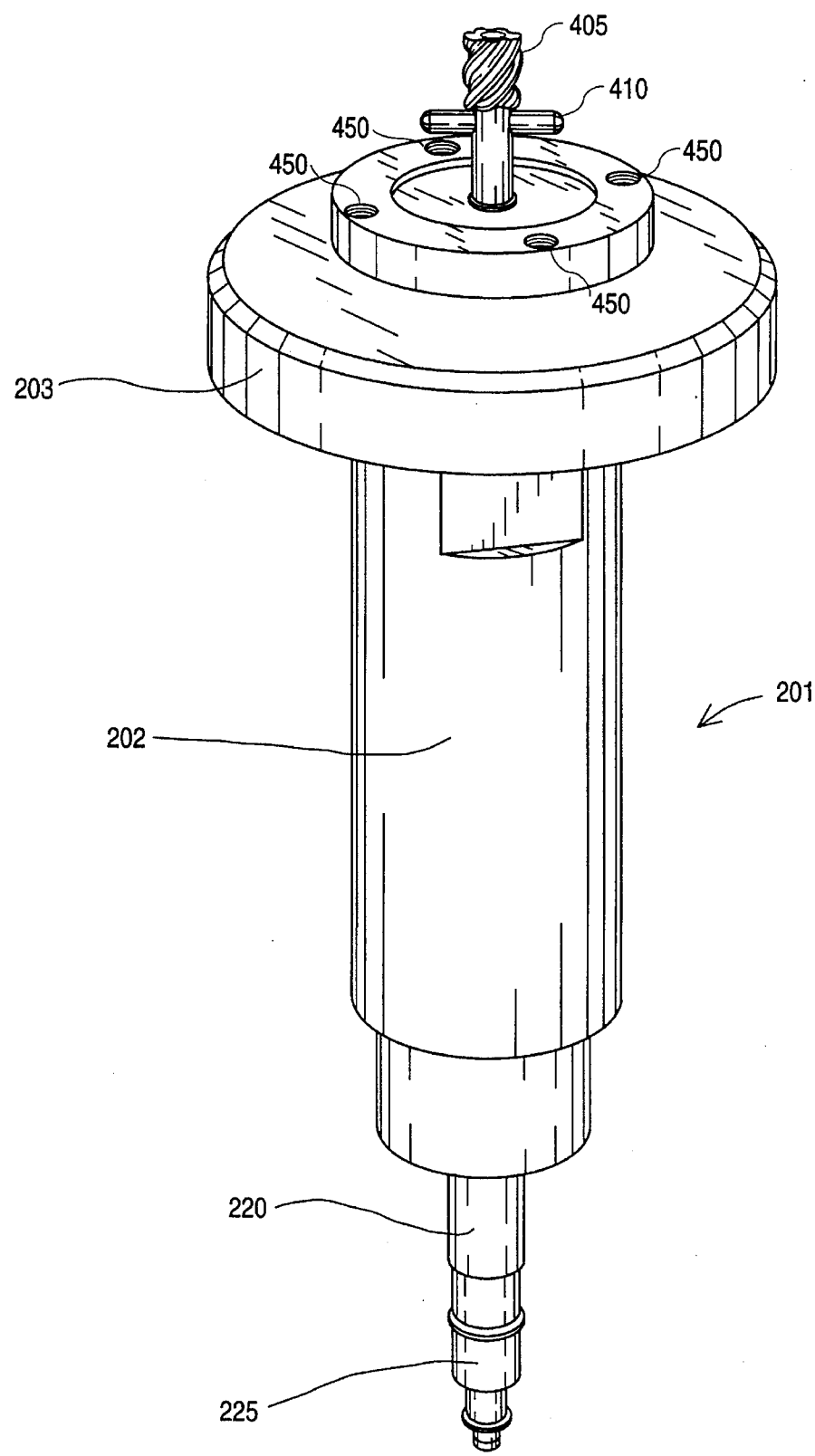
FIG_4

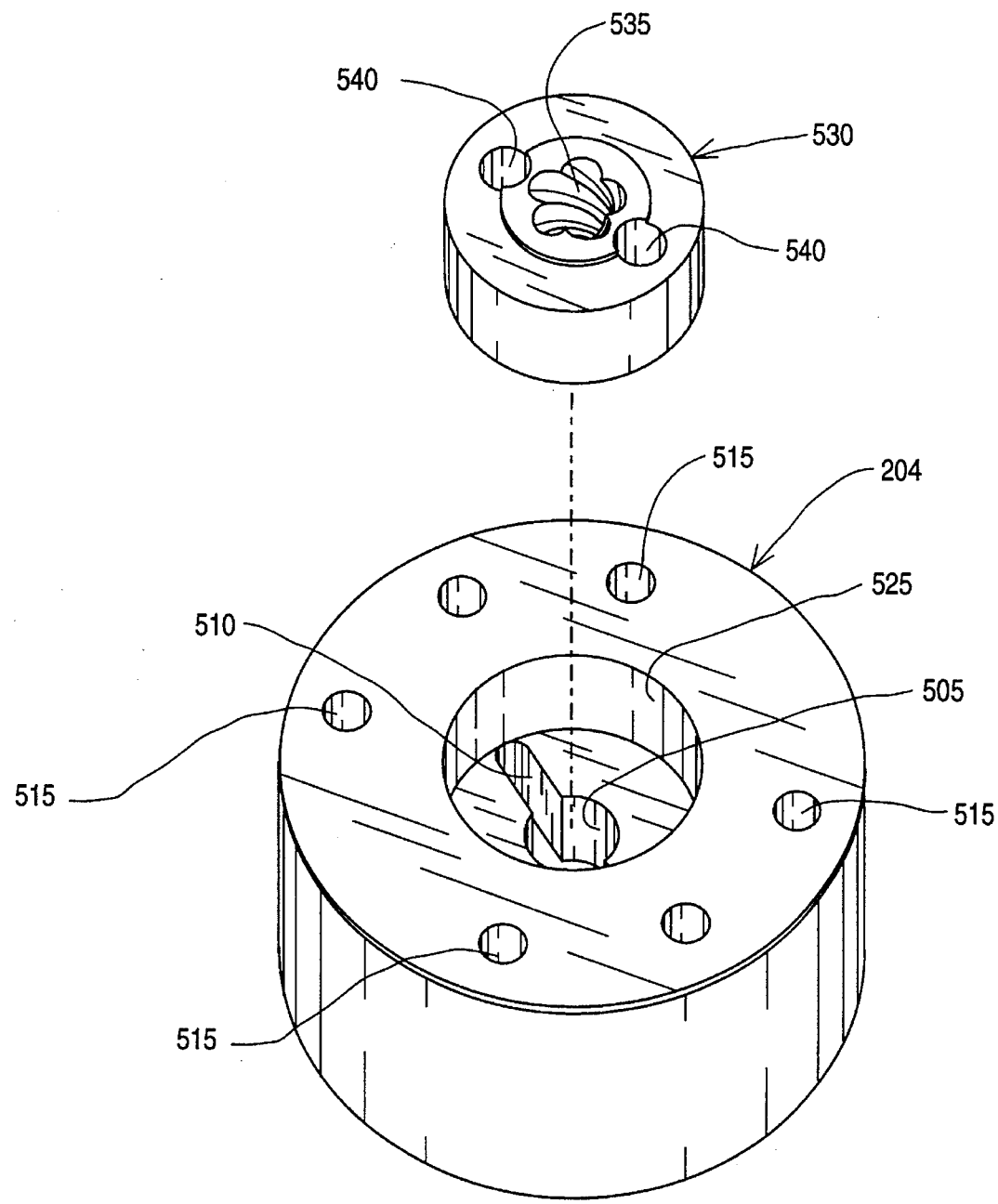
FIG_5

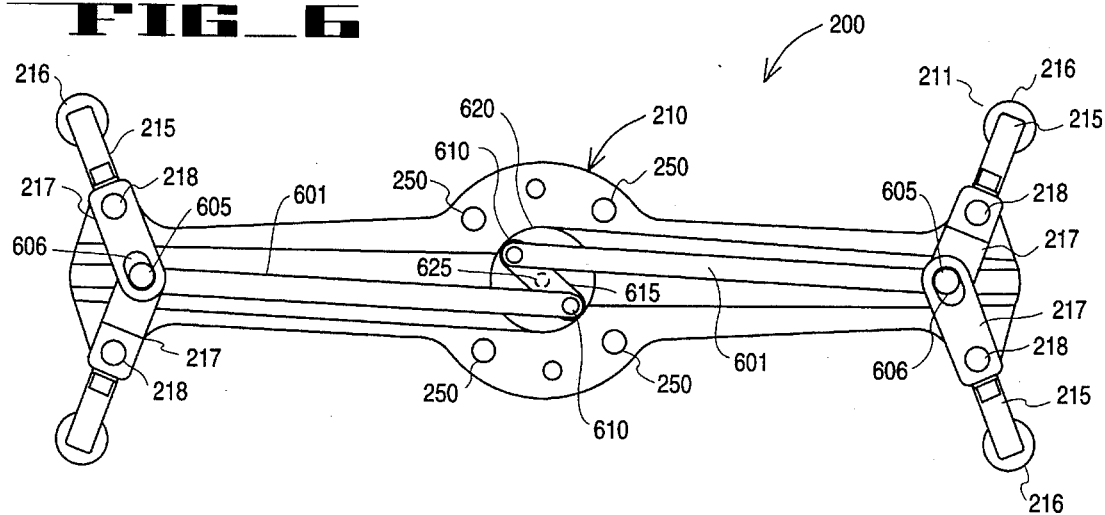
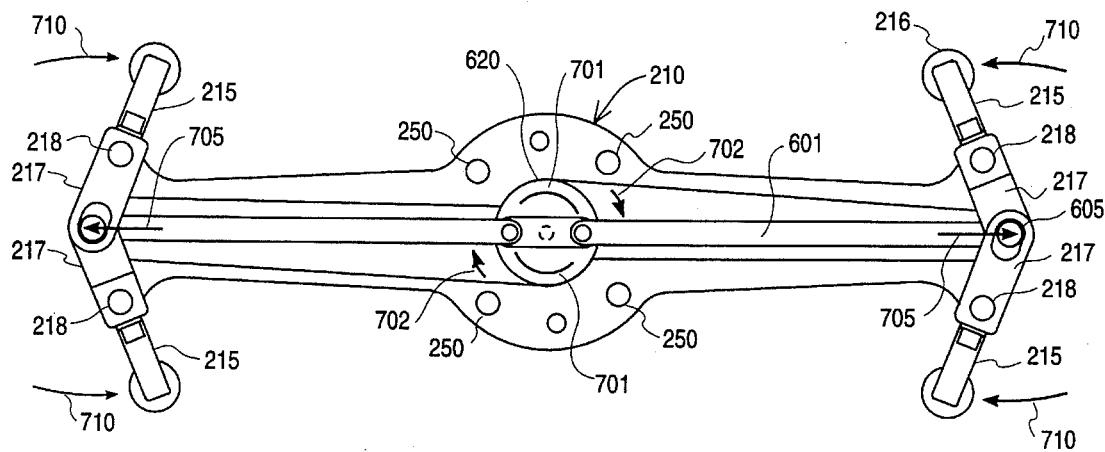
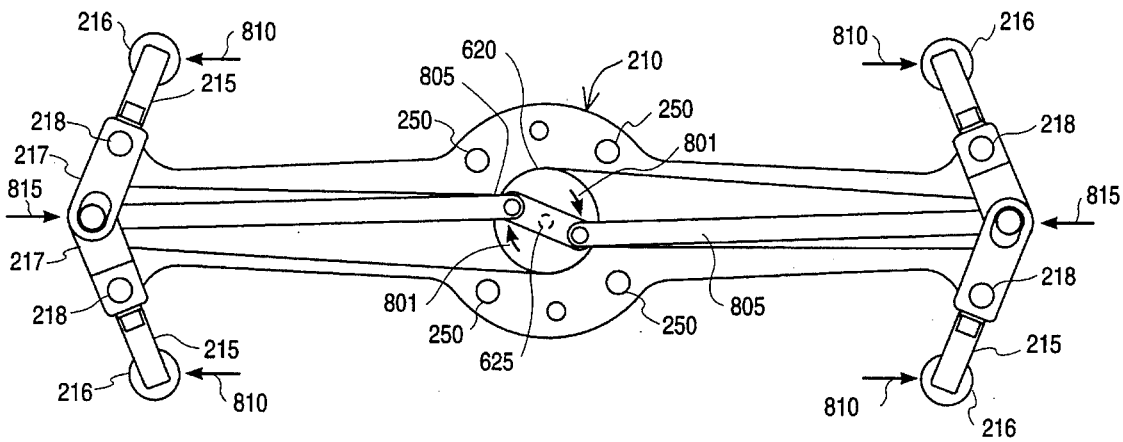

SPINDLE ASSEMBLY WITH IMPROVED WAFER HOLDER

BACKGROUND OF THE INVENTION

1. Field of the Invention

The present invention relates to a method and apparatus for holding a wafer by its edges, and more particularly to a method for holding a wafer by its edges during a spin operation such as a spin dry operation after a wafer scrubbing operation.

2. Background Information

In the fabrication of semiconductor devices, numerous wet clean steps are performed on a substrate such as a semiconductor wafer at various stages throughout the process. In some cases these wet clean steps may comprise scrubbing the wafer with a brush, and may comprise one or more spin rinses wherein the wafer is sprayed with one or more cleaning solutions and/or water while the wafer is spinning. Finally, the wafer is spun dry at a high rate of speed, typically in the 2500–5000 revolution per minute (RPM) range. In many cases, only the front side of the wafer upon which devices are to be formed is cleaned, so that the wafer may be held on its back side by a vacuum chuck. In many other instances, it is desirable to clean both sides of a wafer. For example, semiconductor substrate manufacturers typically scrub both sides at the completion of the slice manufacturing process. Additionally, other processes may require double sided scrubbing. For example, chemical mechanical polishing (CMP), is carried out in a slurry, which is an extremely dirty environment by semiconductor fabrication standards. Therefore, both sides of the wafer must be scrubbed after the CMP operation to remove all contamination prior to subsequent processing. Finally, double sided scrubbing may be used in any application where it is desired to keep the back side of the wafer clean, for example, to reduce contaminants introduced into equipment and/or the process from the back side of the wafer.

In the double sided scrubbing described above, the wafer cannot be held on the back side during the spin dry operation as is done when only the front side of the wafer is cleaned, since the back side of the wafer must be spun dry as well. To provide for spin drying of both the back and front sides, a wafer holder which grips the wafer on its edges has been used in the prior art. Referring to FIG. 1A, an isometric view of a prior art wafer holder is shown. Nest 101 in which the substrate 105 is held is formed by two slide members 106 each having U shaped uprights 107. Wafer holding bumpers 110 are disposed at the top of the upper portion of the uprights as shown. Each of the wafer holding bumpers 110 has a circumferential groove 111 which grip the wafer 105 by its edge. Slide members 106 can move inwardly and outwardly as shown by arrows 115. In particular, the slide members 106 move outwardly to open the nest to release a wafer 105 to some type of conveyor mechanism. Once the nest is in the open position, the next wafer may be placed within the open nest. The slide members 106 then move inwardly to grip this next wafer.

Referring to FIG. 1B, a cross-sectional view of the structure shown in FIG. 1A is illustrated. As shown, slide members 106 comprises slots 120. Cam roller 125 engages both of slots 120. Cam roller 125 is coupled to rod 126 which is disposed within spindle 117. As rod 126 moves in an upward direction, it pushes slide members 120 outwardly to the open position described previously. As rod 126 moves in a downward direction, cam roller 125 pulls slide members 120 in an inwardly or closed position to hold the wafer. Rod 126 is moved up and down by cylinder 130. In operation, cylinder 130 moves cylinder rod 131, connector bar 132, and collar 135 in an up and down direction. Collar 135 is coupled to rod 126 by pin 133. Spring 137, held by stop member 138, puts a downward bias on collar 135.

It will be appreciated that while cylinder 130 is capable of opening and closing the wafer holder of FIG. 1, it cannot be relied on to reliably maintain sufficient force on the wafer to hold it without causing breakage, during all phases of operation. This is because while the wafer is spinning at high speed, a large centrifugal force is generated requiring a correspondingly large inward force or slide members 106 to hold the wafer. Therefore, the far end of the wafer holder, illustrated by portion 156 comprises counterweighting. During the spinning operation, a centrifugal force is created such that the weight at 156 is pulled in an outward direction, thereby pulling the portion of slide members 106 having uprights 107 and wafer holding bumpers 106 in an inward direction to keep the wafer holder in the closed position. This method suffers from the disadvantage that if the counterweight is imprecisely positioned, and/or the weight of the counterweights is different from the specified value, the centrifugal force will vary. Too great a centrifugal force may result in warpage of bendable substrates such as aluminum, and breakage of inflexible substrates such as semiconductor substrates. An insufficient centrifugal force results in the possibility that the wafer will be flung off the holder during the spinning operation. Further, even if the positioning and weight of the counterweights are within specifications, it will readily be appreciated that at the beginning and the end of the spinning operation, when the rotational speed is small, the centrifugal force will be correspondingly small. Thus, the wafers may be flung from the wafer holder at this point. The situation is further complicated by the fact that the forces operating on the wafer holder vary greatly depending on the stage of operation, i.e., whether stopped, accelerating, spinning at high speed, or decelerating.

What is needed is a wafer holder which can be used to hold a wafer in a rotatable spindle without touching the top or bottom surfaces of the wafer. The holder must not release or damage the wafer, must not be speed sensitive, and must not be capable of being opened accidentally.

SUMMARY Of THE INVENTION

An improved wafer holder, preferably for holding a wafer by its edges during a spin dry operation, is disclosed. In one embodiment, two arms are each coupled at one end to wafer holding members, each having two wafer holding bumpers. The other end of the arms are coupled to a thrust bearing rotatable about an axis in a central portion of the wafer holder, such that rotation about the axis causes a reciprocating motion of the arms. When the thrust bearing is in a central position such that the arms are fully extended, the wafer holding members are essentially in the closed position. When the thrust bearing is rotated in a first direction, there is a sufficient range of motion to allow the wafer holder to open. When the thrust bearing is rotated in the opposite direction toward the central position, the wafer holding members close. Motion in this direction is limited so that the wafer holder cannot open by further motion in this direction. Outward forces on the wafer holding members cannot open them because the outward force pushes the arms in the direction where further motion is prevented. The arms may thus be toggled into a locked position with the wafer holding members closed, securely holding the wafer. In this way, forces exerted on the wafer holding members do not cause the wafer holder to inadvertently open. A rod is provided within the spindle assembly to allow for turning of the thrust bearing to toggle the wafer holder member between the open and the closed position.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which:

FIG. 1A illustrates an isometric view of a prior art spindle assembly and wafer holder.

FIG. 1B shows a cross-sectional view of the structure of FIG. 1A.

FIG. 2 shows the spindle assembly and wafer holder of a currently preferred embodiment of the present invention in an open position.

FIG. 3 shows the wafer holder and spindle assembly of a currently preferred embodiment of the present invention in a closed position.

FIG. 4 illustrates a portion of the internal mechanism of the substrate holder and spindle assembly of a currently preferred embodiment of the present invention.

FIG. 5 shows a further internal portion of the substrate holder and spindle assembly of a currently preferred embodiment of the present invention.

FIG. 6 shows a view of the underside of the substrate holder of a currently preferred embodiment of the present invention in the open position.

FIG. 7 shows the underside of the substrate holder of a currently preferred embodiment of the present invention in the closed position.

FIG. 8 shows the underside of the substrate holder of a currently preferred embodiment of the present invention in the closed position.

DETAILED DESCRIPTION

An improved substrate holder is disclosed. In the following description, numerous specific details are set forth such as specific materials, dimensions, configurations, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although the present invention is described in conjunction with a spin drying operation performed on a semiconductor wafer after a double sided scrubbing operation, it will be appreciated that the substrate holder of the present invention may be used to hold any substrate during any processing operation, particularly where spinning without contacting either the front or back surface of a substrate is desired.

FIG. 2 shows a side view of a currently preferred embodiment of wafer holder 200 mounted on spindle assembly 201. Spindle assembly 201 comprises housing 202, collar 203, and head 204. Wafer holder 200 comprises housing 210 and two wafer holding members 211. Wafer holder 200 is mounted on spindle assembly 201 by hex head screws 251 which extend through openings 250 in housing 210, and through openings (not shown) in head 204, and which screw into spindle assembly 201. Each wafer holding member 211 comprises two generally L-shaped members 215, each having a wafer holding bumper 216 on the top thereof. Each of the L-shaped members 215 is further coupled to a pin 218 extending through a portion of housing 210. Each pin 218 is coupled to a pivoting arm 217. Housing 210 further comprises two arms (not shown in FIG. 2) each coupled to both of the L-shaped members 215 (via the above described pin 218 and pivoting arm 217) of one of wafer holding members 211. The coupling of the arms to the pivoting arms 217, will be discussed in more detail in relation to FIGS. 6–8. In a currently preferred embodiment, most of the portions of wafer holder 200 including housing 210, L-shaped members 215, pivoting arms 217, and pins 218 are made of anodized aluminum. The various screws used to hold the parts together are hex type screws made of stainless steel. The wafer bumpers 216 are made of Delrin™, as is head 204 and collar 203. Also in a currently preferred embodiment, spindle assembly 201 including housing 202 spindle 220 and rod 225 are made of stainless steel. It will be appreciated that other materials may be used depending upon the environment in which the wafer holder is used.

In typical use, spindle assembly 201 and wafer holder 200 are mounted in, for example, the spin rinse/dry station of a wafer scrubbing system by fixably attaching housing 202 to the body of the system in which the spinner is placed. A motor is coupled to spindle 220 via, for example, a belt. It will be appreciated that the present invention may be utilized in a variety of systems having a variety of types of spindles and means for rotating the spindle. Referring again to FIG. 2, rod 225 is disposed within and is moveable up and down within shaft 220. Rod 225 is moved up and down by a mechanism such as cylinder 130 and associated components shown and described in relation to FIGS. 1A and 1B. Rod 225 is further coupled to the arms in housing 210, such that when rod 225 is moved up and down, wafer holding members 211 move between an open and a closed position. For example, in FIG. 2, rod 225 is in the up position so that wafer holding members 211 are in the open position shown. In this position, both of the L-shaped members 215 on both wafer holding members 211 are rotated back away from the center of wafer holder 200. The operation of rod 225 in opening and closing the wafer holder 200 will be described in more detail in relation to FIGS. 6–8. The region between the wafer holding members 211, often referred to as the "nest," is, in the open position, larger than the diameter of wafers to be held in wafer holder 200 so that a wafer may be loaded into wafer holder 200. For example, a belt assembly, vacuum wand, or robotic arm may place a wafer centered in the nest of wafer holder 200 when wafer holder 200 is in the open position shown in FIG. 2. Wafer 230 is shown in dashed outline form, in the position in which the loading mechanism (not shown) places it during loading and from which the loading mechanism removes it during unloading.

Referring to FIG. 3, wafer holder 200 is shown in the closed position. In this position, each of the L-shaped members 215 is swung inward towards the center of the wafer holder 200. In this position, the wafer holding members 211 are positioned such that a wafer of a given diameter snugly fits with its edges positioned in the indentation in each of the four bumpers 216. The positioning of a wafer 230 is again shown in dashed outline form. As can be seen, the wafer is disposed within the indentations in bumpers 216. As shown, rod 225 has been pulled down, thereby pulling each of the L-shaped members 215 in the closed position shown. Again, the operation of rod 225 will be discussed in more detail in conjunction with FIGS. 6–8.

FIG. 4 shows spindle assembly 201 with head 204 removed so that the upper portion of rod 225 disposed within head 204 is visible. As can be seen, the upper portion of rod 225 comprises a helix 405 in a currently preferred embodiment. Also as shown, pin 410 extends through rod 225. Pin 410 mates in a slot in head 203, shown in FIG. 5. Screws 250 of FIG. 2 screw into screw holes 450 at the top of spindle assembly 201 to attach head 204 and wafer holder 200 to spindle assembly 201.

Referring to FIG. 5, an exploded top-down view of head 204 and insert 530, removed from spindle assembly 201 and with wafer holder 200 removed, is shown. When head 204 is placed atop spindle assembly 201, helix 405 is inserted (from below) into opening 505 while pin 410 is inserted into slot 510. As mentioned earlier, rod 225 is movable up and down within spindle 220 to open and close wafer holder 200. In a currently preferred embodiment, when rod 225 is in the down position, the upper portion of helix 405 of FIG. 4 extends a slight distance above the upper surface of opening 505, and pin 410 of FIG. 4 is disposed near the lower portion of slot 510. Also in a currently preferred embodiment, when rod 225 is in the up position, the upper portion of helix 405 extends approximately to the top of opening 525, while pin 410 remains disposed within slot 510, near the upper portion thereof. It will be appreciated that many variations on the positioning of components as described in a currently preferred embodiment may be made by one of skill in the art. As can be seen, both the opening 505 and slot 510 are disposed in the lower portion of head 204, with opening 525 disposed in an upper portion.

Also shown in FIG. 5 is insert 530. As shown, insert 530 is disposed within opening 525 of head 204. Insert 530 comprises helical groove 535 and openings 540. When insert 530 is disposed within recess 525 of head 204, helical groove 535 mates with helix 405. When rod 225 is in the down position as shown in FIG. 3, the top of helix 405 is disposed near a lower portion of helical groove 535. When rod 225 is in the up position shown in FIG. 2, the top of helix 405 is disposed approximately flush with the upper surface of insert 530. In this regard, it should be noted that pin 410 shown in FIG. 4 remains within slot 510 during the entire up and down motion. This prevents rotation of rod 525 as it is pushed up and down so that all rotational motion is translated into insert 530. Thus, when rod 525 is pushed in the upward direction, insert 530 rotates in a counterclockwise direction, and when rod 525 is pulled in a downward direction, insert 530 rotates in a clockwise direction. Note that when head 204 is coupled to wafer holder 200 and spindle assembly 201 as shown, for example, in FIGS. 2 and 3, by placing screws 251 through openings 250 of housing 210, openings 515 of head 204 and into screw holes 450, wafer holder 200 is disposed on top of insert 530. This prevents upward motion of insert 530 as rod 225 is moved upward, so that the above described rotational movement of insert 530 occurs. As will be discussed below, insert 530 is coupled to the earlier described arms of wafer holder 200 via openings 540. It should be noted that insert 530 fits in recess 525 with a sufficient amount of clearance such that there is little frictional engagement of insert 530 with head 204 around the perimeter. Since there is only minimal frictional contact of insert 530 with head 204, and since the combined weight of head 204 and wafer holder 200 is much greater than that of insert 530, the resistance to any rotational movement of head 204 is much greater than that of insert 530, such that essentially all rotational motion as rod 225 moves up and down is translated into insert 530, and essentially none is transferred into the head 204/wafer holder 200 combination.

FIGS. 6–8 shows the bottom side of wafer holder 200. In FIGS. 6–8, wafer holder 200 is upside down with respect to the position shown in FIGS. 2 and 3. In the following discussion, various motions and movement of components shown in FIGS. 6–8 will be discussed as they appear in these Figures. It will be understood that these direction may be reversed compared to what is observed when wafer holder 200 is disposed right side up as shown in FIGS. 2 and 3. For example, clockwise motion of insert 530 as seen in FIG. 5 corresponds to counter-clockwise motion as seen in FIGS. 6–8, and vice-versa. Motions and movements discussed in relation to earlier Figures, will continue to be discussed as they appear in those Figures. For example, upward or downward motion of rod 225 of FIGS. 2 and 3 refers to upward and downward in relation to the orientation shown in FIGS. 2 and 3. As shown, wafer holder 200 comprises two arms 601 each attached to both of shafts 217 of a single wafer holding member 211. The arms 601 are each coupled to two pivoting arms 217 via pin 605. Each pin 605 is attached to an arm 601 and extends through an opening (not shown) in the bottom pivoting arm 217 and then through a similar opening 606 in the top pivoting arm 217. As shown, a pin 610 is disposed at the opposite end of each of arms 601. Pins 610 extend in both an upward and a downward direction from arms 601. The portions of pins 610 extending in an upward direction mate into openings 540 of insert 530 shown in FIG. 5. The portions of pins 610 that extend in a downward direction mate into indents in thrust bearing 615 which is disposed within recess 620 of housing 210. Thrust bearing 615, in a currently preferred embodiment, is made of Delrin™, and may easily turn within recess 620. Further, on the underside of thrust bearing 615 a small tab 625, shown by dashed lines, protrudes in a downward direction into a further recess in housing 210 and holds thrust bearing 615 in place as it turns.

As shown in FIG. 6, wafer holder 200 is in the open position when arms 601 are in the position shown. With wafer holder 200 in the position shown in FIG. 6, rod 225 is in the fully up position shown in FIG. 2. Referring to FIG. 7, as the rod 225 of FIG. 2 is pulled down, insert 530 rotates counter-clockwise as viewed in FIG. 5. As described above, arms 601 and thrust bearing 615 are coupled to insert 530 by pins 610 inserted in openings 540 of insert 530. This causes thrust bearing 615 and the ends of arms 601 attached thereto to rotate clockwise as shown by arrows 701 and 702 in FIG. 7. This rotational movement is translated into essentially lateral motion at the other ends of the arms 601 as shown by arrows 705, such that arms 601 and pin 605 push both of the pivoting arms 217 in an outward direction, which pivot about pins 218. As each pivoting arm 217 is fixedly attached to the pin 218, this pivoting motion causes each pin 218 to rotate. Further, each L-shaped member 215 is similarly fixedly attached to the pin 218, so that the rotation of pin 218 causes L-shaped member 215 to swing in as shown by arrows 710.

Note that in the position shown in FIG. 7, wafer holder 200 is in the closed position. In this position, insert 530 and thrust bearing 615 have reached an apex, so that forces which tend to open the wafer holder 200, e.g., forces on any portion of the wafer holder 200 resulting in a force on arms 601 opposite in direction to that shown by arrows 705, cannot cause insert 530 and thrust bearing 615 to rotate since no component of the force is applied in a rotational direction with respect to these components. It will be appreciated that it is possible that some forces on a part of the system may cause movement of thrust bearing 615/insert 530 and arms 601 out of the position shown in FIG. 7. Therefore, referring to FIG. 8, in a currently preferred embodiment, rod 225 in its fully down position rotates insert 530 of FIG. 5 such that the thrust bearing 615 and arm 601 move as shown by arrows 801. Note that the movement of arms 601 in the direction of arrows 801 is limited by contact with housing 210 at the points 805. Thus, thrust bearing 615 and insert 530 cannot continue to rotate any further in this direction nor can arm 601 move any further in this direction. Note further that the lateral change in position of arms 601 between the position shown in FIGS. 7 and 8 is relatively small, so that the wafer holding members 211 move only a negligible amount between the positions shown in FIGS. 7 and 8. It will be appreciated that there is a small range of positions of wafer holding members 211 that result in a sufficient force to hold a wafer. In other words, the closed position of the wafer holder 200 actually comprises a range of positions. The wafer holder 200 is designed such that when the components are within the positions shown in FIGS. 7 through 8, the wafer is firmly grasped by all bumpers 216 of wafer holding members 211.

In the present invention, the wafer may be firmly held, without risk of accidental release, without the use of counterweights. As described above, there is a very slight amount of motion of wafer holding members 211 between the positions shown in FIGS. 7 and 8. Thus, movement from the position shown in FIG. 8 to the position shown in FIG. 7 requires a slight squeezing of the wafer. Because of this squeezing, inadvertent motion of insert 530 and thrust bearing 615 in the direction opposite to arrows 801 is inhibited. Furthermore, again referring to FIG. 8, note that any outward force, such as centrifugal force during spinning, pushes the L-shaped members 215 outward in the direction as shown by arrows 810. This results in an inward force, as shown by arrows 815, on arms 601. This inward force further pushes the arms 601 in the direction shown by arrows 801. Since the arms are in contact at points 805 with housing 210, this force cannot result in any motion or opening of the wafer holding members 211. Therefore, by toggling insert 530 and thrust bearing 615 to or past the position shown in FIG. 7, forces on the arms, or wafer holding members, whether caused by acceleration, deceleration or any other cause, cannot result in opening of the nest of wafer holder 200. Thus, the wafer holder is locked in the closed position at or past the position shown in FIG. 7. In a currently preferred embodiment, a slight downward force is maintained on rod 225 during wafer processing by the mechanism which moves rod 225 up and down to further reinforce the locking nature of the wafer holding member.

To release a wafer, rod 225 is pushed in an upward direction. This rotates the insert 530 clockwise as viewed in FIG. 5, causing arms 601 and thrust bearing 615 to rotate counter-clockwise as seen in FIGS. 6–8, i.e., in the opposite direction of that shown in the sequence from FIGS. 6–8. This moves the wafer holding members 211 from the closed position shown in FIG. 8 to the open position shown in FIG. 6. Of course, in use, the opening of wafer holder 200 occurs only after the spindle assembly has stopped all spinning motion, positioned the flat of the wafer in a predetermined position, if desired, and after some type of transport mechanism, such as that described earlier, has moved into position to remove the wafer from the wafer holder 200.

It will be appreciated that the specific embodiment shown and described herein need not be employed to practice the present invention. For example, although each wafer holding member 211 is illustrated as having two L-shaped members 215 coupled via various pins and arms to the arm 601, other wafer holding means or members may be used. For example, the wafer holding mechanism may comprise a single U-shaped member having two wafer holding bumpers similar to the members 107 of FIGS. 1A and 1B. As in the above described embodiment, the motion of the arms 601 should be prevented after the thrust bearing or similar mechanism has toggled to or past the apex to lock the wafer holder in the closed position. In this regard it should be noted that in any embodiment of the present invention, the motion of the arms need not be limited by the configuration of the housing as shown and described above, but may be limited by other methods or devices such as set screws, tabs, etc. Additionally, it will be appreciated that the motion of the arms need not be limited by direct contact with the arms themselves. Rather, movement of the arms may be limited by limiting further rotation of the insert 530 or thrust bearing 615 by similar methods or devices to those described above. It will also be appreciated that in some embodiments, a thrust bearing such as thrust bearing 615 may not be necessary if the surface upon which the arms rest allows them to move freely when turned by a member such as insert 530. Furthermore other alternative embodiments may be used. For example, although the preferred embodiment uses a rod inside a spindle to provide the rotational motion for the arms, the spindle may be disposed within the rod or shaft which provides the rotational motion for the arms. As another alternative, the insert 530 may comprise a male helix member protruding downward, while the rod comprises a helical groove to provide for the rotational motion of the insert. Alternatively, in place of the helix and helical groove, a bell crank or similar member, coupled to a rod such as rod 225, may be disposed in a position to turn a thrust bearing such as thrust bearing 615, and/or alternatively to turn an insert such as insert 530 which may be coupled to the thrust bearing. As a further alternative, other means may be used to provide the rotational motion described above. For example, the rod 225 may be turned instead of moved in an upward and downward direction to provide the rotation of the arms 601. In such an embodiment, the rod 225 may be coupled directly to the arms 601, or may coupled through a lead screw and lead nut combination. In such an embodiment, a motor may be coupled to the rod 225 via a belt to provide the turning motion. However, an embodiment wherein up/down motion is translated to rotational motion is generally easier to implement. In this regard, although the wafer holder in the embodiment described above is open when the rod is in the up position and closed when the rod is in the down position, it will be appreciated that, if desired, the wafer holder may be open with the rod in the down position and closed with the rod in the up position in any embodiment of the present invention. Finally, numerous other modifications and substitution of components will be apparent to one of ordinary skill in the art.

Thus, an improved wafer holder has been described. Although specific embodiments, including specific equipment, configurations, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A substrate holder comprising:
   a first and a second arm, said first and said second arms each coupled to a substrate holding member, said substrate holding members having an open and a closed position, wherein in said closed position said substrate holding members hold said substrate; and, an arm positioning member coupled to each of said arms, said arm positioning member movable to move said first and second arms to position said substrate holding members in said open position and said closed position, said arms having a locked position when said substrate holding members are in said closed position.

2. The substrate holder as described in claim 1 wherein said substrate holder is coupled to a spindle, said spindle rotatable about an axis.

3. The substrate holder as described in claim 1 wherein said arm positioning member moves to move said first and second arms to position said substrate holding members in said open and said closed position while said substrate holder remains at rest.

4. The substrate holder as described in claim 1 wherein said arm positioning member is located at the center of said substrate holder, wherein said first and second arms coupled to said arm positioning member extend outward from said arm positioning member, and wherein said substrate holding members are coupled to the opposite end of said first and second arms from said arm positioning member.

5. A substrate holder comprising:

a first and a second arm, said first and said second arms each coupled to a substrate holding member, said substrate holding members having an open and a closed position, wherein in said closed position said substrate holding members hold said substrate; and, an arm positioning member coupled to each of said arms, wherein said arm positioning member rotates, said rotation being translated to lateral movement of said first and second arms to position said substrate holding members in said open position and said closed position, said arms having a locked position when said substrate holding members are in said closed position, wherein said arm positioning member reaches an apex when said substrate holding members are within said closed position, and wherein continued motion of said arms is inhibited when said arm positioning member reaches a position at or past said apex.

6. The substrate holder as described in claim 2 wherein an outward force applied to said substrate holding members when said substrate holding members are in said closed position does not cause rotation of said arm positioning member.

7. The substrate holder as described in claim 3 further comprising a shaft coupled to said arm positioning member, wherein linear motion of said shaft is translated to said rotational motion of said arm positioning member.

8. The substrate holder as described in claim 5, wherein said substrate holder is coupled to a spindle, wherein said spindle is rotatable about an axis, and wherein one of said shaft and said spindle is disposed within the other of said shaft and said spindle.

9. The substrate holder as described in claim 3 further comprising a shaft, wherein one of said shaft and said arm positioning member comprises a helix, and the other of said shaft and said arm positioning member comprises a helical groove, such that linear motion of said shaft in a first linear direction rotates said arm positioning member in a first rotational direction, and linear motion of said shaft in a second linear direction rotates said arm positioning member in a second rotational direction, to move said arm positioning member to position said substrate holding members in said open and said closed position.

10. The substrate holder as described in claim 7, wherein said substrate holder is coupled to a spindle, wherein said spindle is rotatable about an axis, and wherein one of said shaft and said spindle is disposed within the other of said shaft and said spindle.

11. The substrate holder as described in claim 3 wherein said substrate holder is coupled to a spindle, said spindle rotatable about an axis.

12. The substrate holder as described in claim 2 further comprising a shaft coupled to said arm positioning member, wherein linear motion of said shaft is translated to said rotational motion of said arm positioning member.

13. The substrate holder as described in claim 4, wherein said substrate holder is coupled to a spindle, wherein said spindle is rotatable about an axis, and wherein one of said shaft and said spindle is disposed within the other of said shaft and said spindle.

14. The substrate holder as described in claim 2 further comprising a shaft, wherein one of said shaft and said arm positioning member comprises a helix, and the other of said shaft and said arm positioning member comprises a helical groove, such that linear motion of said shaft in a first linear direction rotates said arm positioning member in a first rotational direction, and linear motion of said shaft in a second linear direction rotates said arm positioning member in a second rotational direction, to move said arm positioning member to position said substrate holding members in said open and said closed position.

15. The substrate holder as described in claim 6, wherein said substrate holder is coupled to a spindle, wherein said spindle is rotatable about an axis, and wherein one of said shaft and said spindle is disposed within the other of said shaft and said spindle.

16. The substrate holder as described in claim 2 wherein said substrate holder is coupled to a spindle, said spindle rotatable about an axis.

17. A substrate holder comprising:

a spindle, said spindle rotatable about an axis;

a shaft, wherein one of said spindle and said shaft is disposed within the other of said spindle and said shaft;

an arm positioning member coupled to said shaft;

an arm coupled to said arm positioning member at a first position of said arm;

a substrate holding member coupled to said arm at a second position of said arm, wherein rotational motion of said arm positioning member moves said substrate holding member between an open and a closed position.

18. The substrate holder as described in claim 15 wherein linear motion of said shaft is translated to said rotational motion of said of said arm positioning member.

19. The substrate holder as described in claim 16 wherein one of said arm positioning member and said shaft comprises a helix and the other of said arm positioning member and said shaft comprises a helical groove to translate said linear motion of said shaft into said rotational motion of said arm positioning member.

20. The substrate holder as described in claim 17 wherein said rotation of said arm positioning member is translated to lateral movement of said arms, wherein said arm positioning member reaches an apex when said substrate holding members are within said closed position, wherein continued motion of said arm is inhibited when said arm positioning member reaches a position at or past said apex.

21. The substrate holder as described in claim 16 wherein said rotation of said arm positioning member is translated to lateral movement of said arms, wherein said arm positioning member reaches an apex when said substrate holding members are within said closed position, wherein continued motion of said arm is inhibited when said arm positioning member reaches a position at or past said apex.

22. The substrate holder as described in claim 15 wherein said rotation of said arm positioning member is translated to lateral movement of said arms, wherein said arm positioning member reaches an apex when said substrate holding members are within said closed position, wherein continued motion of said arm is inhibited when said arm positioning member reaches a position at or past said apex.

* * * * *